United States Patent [19]
Potter

[11] 3,942,108
[45] Mar. 2, 1976

[54] DIGITAL TEST INSTRUMENT

[75] Inventor: Thomas R. Potter, Los Alamitos, Calif.

[73] Assignee: Indicator Controls Corporation, Gardena, Calif.

[22] Filed: Sept. 3, 1974

[21] Appl. No.: 503,038

[52] U.S. Cl. .................................. 324/59; 324/34 R
[51] Int. Cl.² .......................................... G01R 27/26
[58] Field of Search ............ 324/59, 34 R; 340/38 L

[56] References Cited
UNITED STATES PATENTS

| | | | |
|---|---|---|---|
| 3,036,267 | 5/1962 | Semelman | 324/59 X |
| 3,039,052 | 6/1962 | Coffin et al. | 324/59 X |
| 3,417,328 | 12/1968 | Tiemann | 324/59 |
| 3,808,524 | 4/1974 | Tarassoff et al. | 324/34 R |

Primary Examiner—Stanley T. Krawczewicz
Attorney, Agent, or Firm—Keith D. Beecher

[57] ABSTRACT

A high resolution digital test instrument is provided which has particular, although not exclusive, utility in testing the inductance and inductance changes of wire loops which are embedded in roadways and which are incorporated into vehicle presence sensing systems. The test instrument provides a simple means for determining the sensitivity of the loop to vehicles of different sizes; as well as for determining whether the loop inductance is susceptible to drift, whether open circuit or short circuit conditions exist, whether there are intermittent circuit breaks, and a variety of other conditions. The instrument includes frequency counting circuitry which counts, on a selected time basis, the output frequency of a Class C oscillator. The frequency of the oscillator is determined by the combined loop and lead-in inductance together with the lead capacitance of the loop circuit being tested. The pulses generated by the oscillator are cyclically counted over a selected time period, and the results are displayed as a frequency measurement.

3 Claims, 4 Drawing Figures

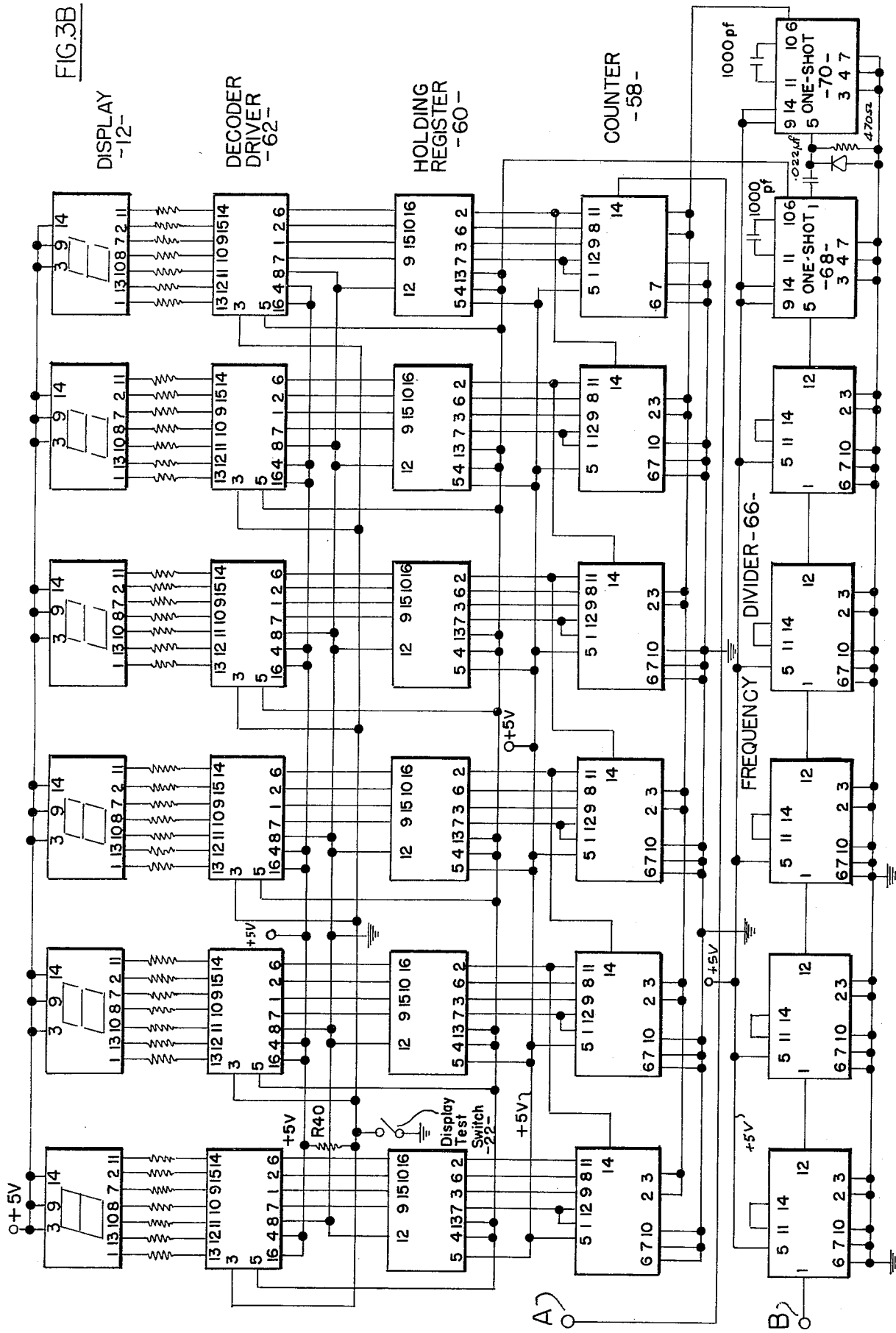

DIGITAL TEST INSTRUMENT

BACKGROUND OF THE INVENTION

The instrument to be described is both a special and a general test instrument. When used as a special test instrument in conjunction with a vehicle sensing system, as mentioned above, the instrument provides accurate measurements as to the overall inductive characteristics of the loops associated therewith, and of the response of the loops to vehicles passing within their confines, while the loops are operating under their actual working conditions.

The instrument of the invention has particular utility for use in conjunction with digital vehicle detection systems as described in copending applications Ser. Nos. 364,492, now U.S. Pat. No. 3,875,555, and 443,299, now U.S. Pat. No. 3,873,964, both of which were filed in the name of the present inventor.

Copending application Ser. No. 443,299, for example, discloses a vehicle detection system which responds to changes in the inductance of a wire loop embedded in a roadway to sense the presence of a vehicle. The loop and associated lead-in connections are used in the system as a frequency-determining network for a Class C oscillator, and a digital circuitry is used to measure the frequency of the oscillator.

The test instrument to be described, likewise, has a Class C oscillator in its circuit, and it is equipped with a receptacle which may receive the plug of a suitable connector which may be easily connected into the loop lead-in network of such a vehicle detection system, without the need to make or break any connections in the system. The test instrument of the invention is basically a frequency counter with a range, for example, of 1 megahertz. The embodiment to be described has a fixed, one second time base. The indicator of the instrument consists of six numeric seven-segment/light emitting diode displays which together provide a one hertz resolution for the instrument.

When the test instrument of the invention is connected in circuit with the loop/lead-in network of a vehicle detection system, its Class C oscillator generates an approximate sine wave near the resonant frequency of the loop/lead-in network, and changes in the resonant frequency of the network due to vehicle influence or environmental changes can be monitored. The one-second time base of the test instrument is obtained in the embodiment to be described, by counting down the output of a 100 kilohertz oscillator, as will be described in more detail subsequently herein.

BRIEF DESCRIPTION OF THE DRAWINGS

FIGS. 3A and 3B jointly represent a further and more detailed diagram of the electric components and circuitry of the system of FIG. 2.

DETAILED DESCRIPTION OF THE ILLUSTRATED EMBODIMENT

Figure 1:
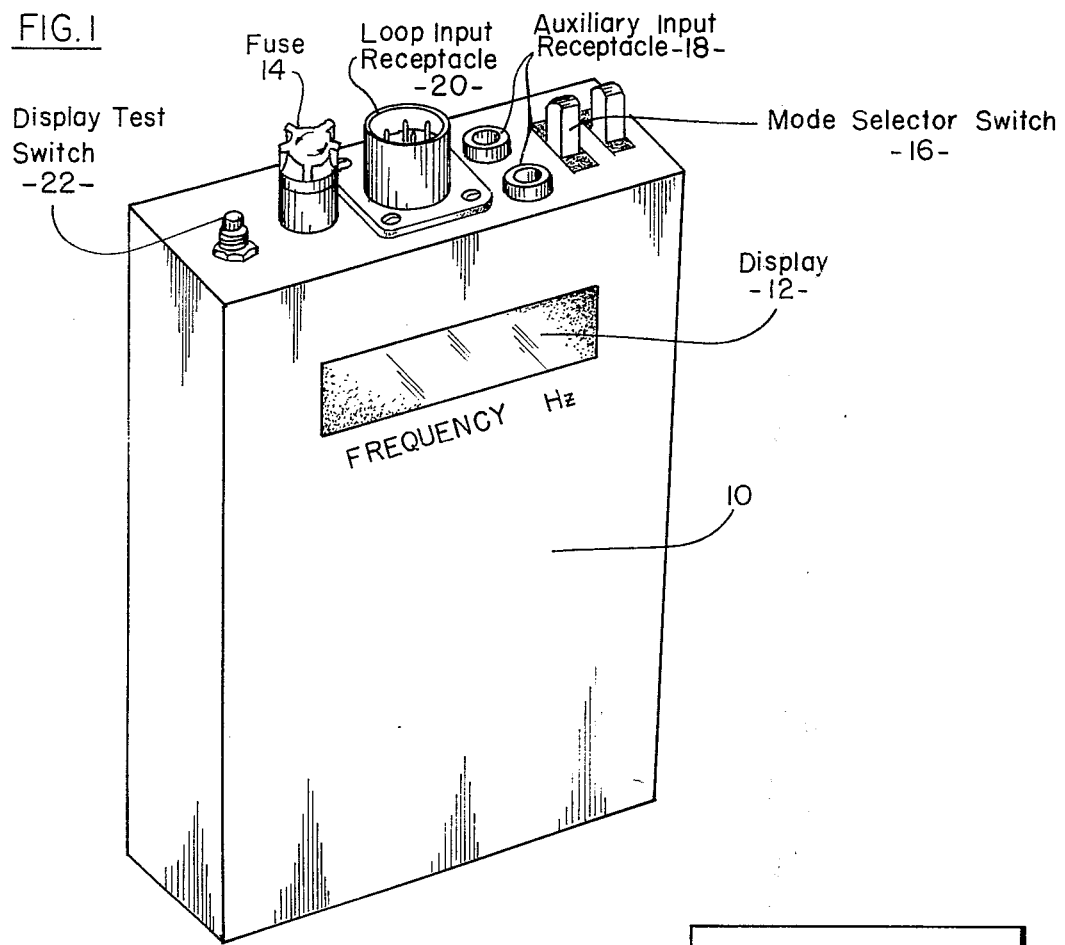
FIG. 1 is a perspective representation of a digital loop test instrument incorporating the concepts of the invention and representing one embodiment of the invention.

As shown in FIG. 1, for example, the digital test instrument of the illustrated embodiment of the invention may be housed in a rectangular casing 10 having an indicator 12 on its front face. The indicator 12, as mentioned above, may consist of six seven-segment light emitting diode numeric displays which, in themselves, are well known in the art.

The instrument includes a replaceable fuse 14 and a mode selector switch 16. As will be described, the mode selector switch 16 provides a selection by the instrument of either an auxiliary input receptacle 18, so that tests may be carried out on any appropriate equipment; or a loop receptacle 20, which permits tests to be carried out on a loop lead-in network of a vehicle detection system; or a further connection which permits a 60 hertz reference test to be carried out. This mode selector switch 16 enables the user to control the signal mormally generated in the instrument, thus eliminating the need for making any internal changes while testing a loop circuit.

The instrument also includes a display test switch 22 which, when actuated, causes the indicator 12 to illuminate a series of eights, so that a check of all segments of each digit of the display, and the associated circuitry, may be carried out. In addition, the test instrument includes a usual power input receptacle 24 (FIG. 3) which serves to connect the instrument to the usual 60 hertz alternating current power source.

Figure 2:
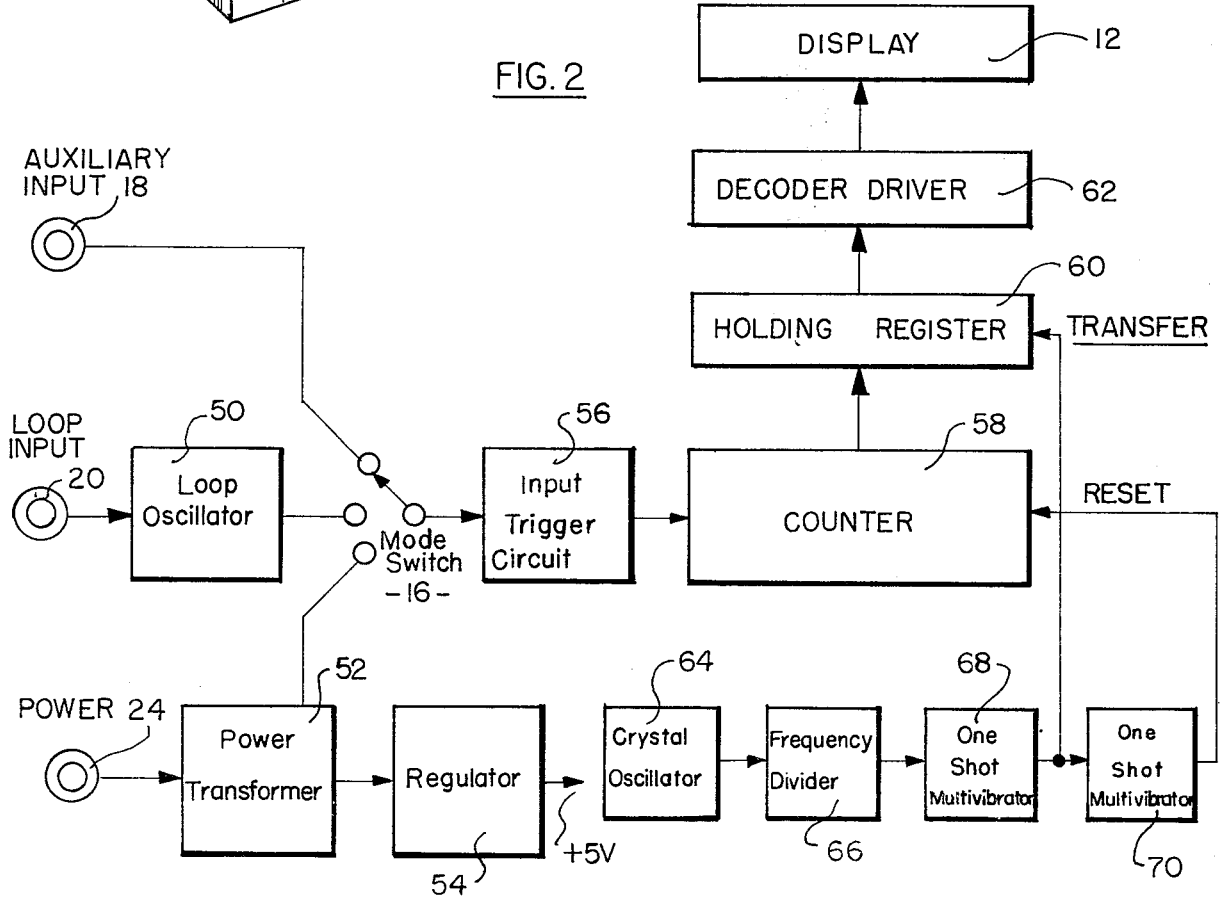
FIG. 2 is a block diagram of the electric components which make up the test instrument.

As shown in a block diagram of FIG. 2, the loop input receptacle 20 is connected to a loop Class C oscillator 50, which, in turn, is connected to one terminal of the mode selector switch 16. The auxiliary input receptacle 18 is connected to another terminal of the mode selector switch. The power input receptacle 14 is connected to a power transformer 52 which provides a 60 hertz signal for another terminal of the mode selector switch 16. The power transformer 52 is connected to a rectifying the regulator circuit 54 which provides, for example, +5 volts regulated direct current output for the system.

The common terminal of the mode selector switch 16 is connected to an input trigger circuit 56 which, in turn, is connected to a six decade counter 58. The counter 58 is connected to a holding register 60 which, in turn, is connected through a decoder driver 62 to the display 12.

The one-second reference time base for the system is derived from a 100 kilohertz oscillator 64 whose output is counted down through a five decade frequency divider counter 66. The output of the counter 66 is introduced to a one-shot multivibrator 68 whose output, in turn, is applied to a further one-shot multivibrator 70. The output of the one-shot multivibrator 68 is applied to the holding register 60 to cause the contents of the counter 58 to be transferred to the holding register at the end of each second. The output of the one-shot multivibrator 70 is used to reset the counter 58 at the end of each 1-second time base.

As mentioned above, when the mode selector switch 16 is connected to the Class C loop oscillator 50, the input trigger circuit 56 is caused to generate pulses near the resonant point of the loop/lead-in network. In this way, and as pointed out above, the actual operation of the loop circuit, including changes in its resonant frequency due to vehicle influence or environmental changes can be quickly monitored.

The counter 58 operates, in the illustrated embodiment on a one-second time base which is generated by counting down the output of the oscillator 64, as described. Output cycles from the Class C loop oscillator 50 are, therefore, accumulated in the six decade counter 50 for each 1-second interval. At the end of each 1-second interval the contents of the decade counter are transferred to the holding register 60 which drives the decoder driver stage 52 which, in turn, controls the display 12. The decade counter 58 is set to zero at the end of each 1-second time base interval, and the next 1-second time base accummulation period is immediately started.

When the instrument of the invention is used as a general purpose counter, the input trigger circuit 56 is disconnected from the loop oscillator 50 by setting the mode selector switch 16 to the auxiliary position, and the input trigger circuit is then connected to the auxiliary input receptacle 18 located on the top panel of the unit. When the mode selector switch 16 is placed in the "60Hz" position, the input trigger circuit 56 is connected to the secondary winding of the power transformer 52, thus providing a 60Hz signal for reference purposes to check the time base, input circuitry and driver circuitry.

In the operation of the test instrument, the test switch 22 of FIG. 2 should first be operated to verify that the display 12 reads 888888. The mode selector switch 16 is then placed in the "60Hz" position to verify that the display should properly read 000060. The mode selector switch is then placed in the "loop" position so that the loop frequency may be read. An indication of 000000 would indicate an open or short circuited loop. Normal loop frequency in most present day vehicle detection systems are in the range of 80KHz to 240KHz depending on the loop configuration and lead-in lengths. Loop sensitivity can be determined by first measuring the loop frequency with no vehicle in the loop area, and by then measuring the loop frequency again with a vehicle in the loop area. Changes in loop inductance can then be determined by appropriate formulas, conversion tables, and curves relating frequency to inductance.

Figure 3A:
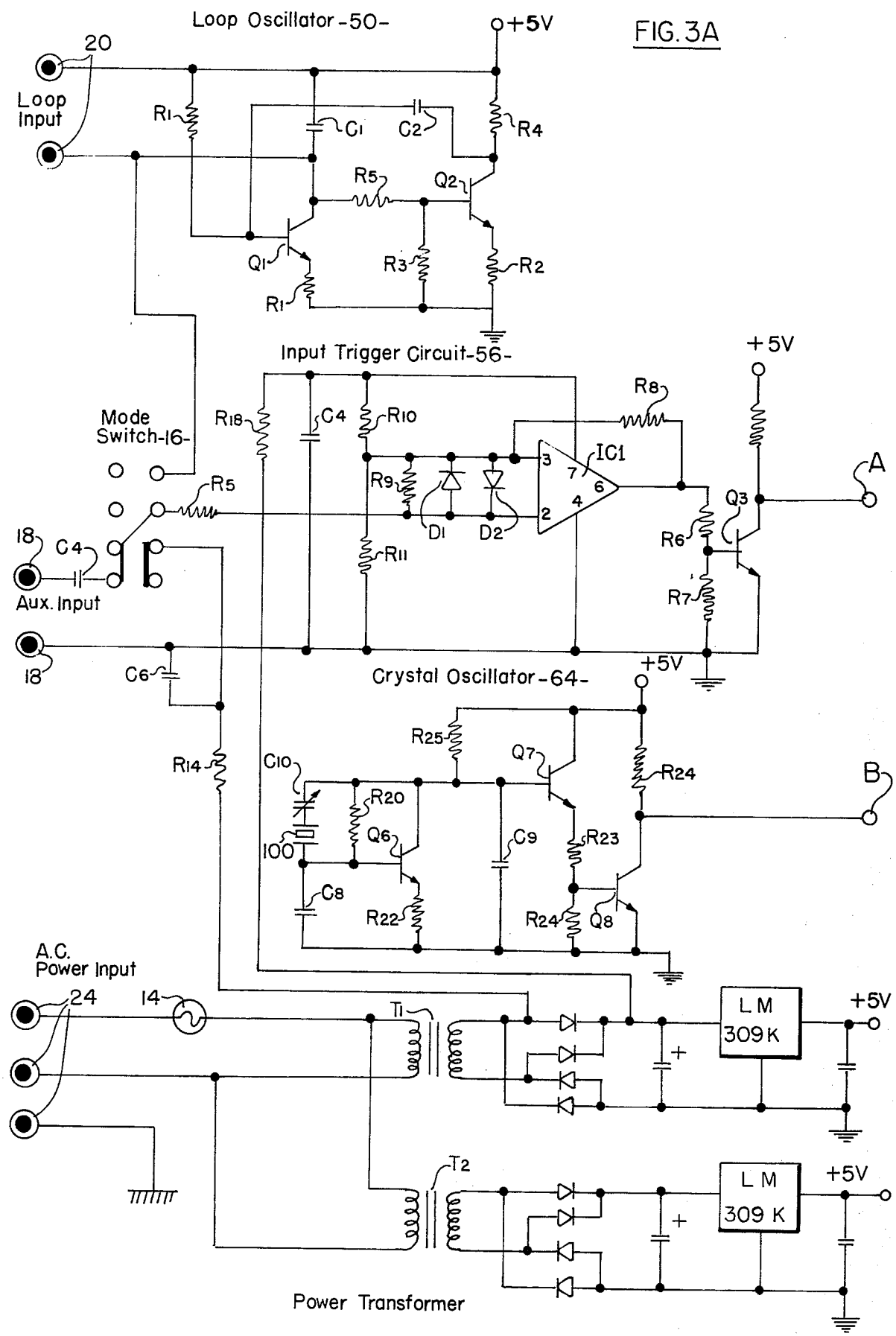

As shown in FIGS. 3A and 3B, the loop oscillator 50 is a Class C oscillator formed by the circuitry of a pair of NPN transistors Q1 and Q2 which may be of the type designated 2N2926. The loop input is connected to a +5 volt direct current excitation lead and to the collector of the transistor Q1. The base of the transistor Q1 is connected to the +5 volt lead through a 24 kilo-ohm resistor R1, and the collector of the transistor is connected to a 5,600 picofarad capacitor C1 which, likewise, is connected to the +5 volt lead.

The emitter of transistor Q1 is connected through a 150 ohm resistor R2 to a grounded lead, and the emitter of the transistor Q2 is connected through a 100 ohm resistor R2 to the grounded lead, whereas the base of the transistor Q3 is connected to the grounded lead through a 4.7 kilo-ohm resistor R3. The collector of the transistor Q2 is connected to the +5 volt lead through an 820 ohm resistor R4. The collector of the transistor Q1 is connected to the base of the transistor Q2 through a 22 kilo-ohm resistor R5. The collector of the transistor Q2 is connected to a 0.01 microfarad capacitor C2, which, in turn, is connected back to the base of transistor Q1.

The output of the loop oscillator 50 is connected to the mode selector switch 16, the common terminal of which is connected to the input of the input trigger circuit 56. The input trigger circuit 56 is formed of an integrated circuit IC1 of the type designated µA709.

The mode selector switch 16 is connected through a 47 kilo-ohm resistor R5 to pin 2 of the integrated circuit IC1. The output pin 6 of the integrated circuit is connected to a 4.7 kilo-ohm resistor R6 which, in turn, is connected to the base of an NPN transistor Q3 of the type designated 2N5224. The emitter of the transistor Q3 is grounded, and the base is connected to a grounded 2.2 kilo-ohm resistor R7. The pin 6 of the integrated circuit IC1 is connected back to pin 3 through a 150 kilo-ohm resistor R8, and pin 3 is connected to pin 2 through a pair of back-to-back diodes D1, D2 and through a 270 kilo-ohm resistor R9. Pin 4 of the integrated circuit IC1 is grounded, and pin 7 is connected to pin 3 through a 4.7 kilo-ohm resistor R10, pin 3 being connected to a 4.7 grounded kilo-ohm resistor R11. The resistors R10 and R11 are shunted by a 100 microfarad capacitor C4.

The auxiliary input connector 18 is connected to ground, and to a 0.02 microfarad capacitor C4 which, in turn, is connected to the mode selector switch 16. The power input receptacle 24 is connected to the primary windings of a pair of power transformers T1 and T2, the secondary windings of which are connected through appropriate rectifier and regulator circuits, as shown, to provide the +5 volt regulated direct current voltages for the system. The secondary of the transformer T1 is connected through a 4.7 kilo-ohm resistor R14 to the mode selector switch, the resistor being connected to a grounded 0.22 microfarad capacitor C6. This connection provides the 60Hz reference signal to the mode selector switch. The rectifier and regulator circuit associated with the secondary of the transformer T1 also supplies a direct current voltage through a 100 ohm resistor R18 to the circuit of the integrated circuit IC1.

The crystal oscillator 64 includes a 100KHz crystal 100 which is connected to the base of an NPN transistor Q6 which may be of the type designated 2N2926. The base of the transistor Q6 is connected to a grounded 1,000 picofarad capacitor C8, and to a 22 kilo-ohm resistor R20. The resistor R20 and the collector of the transistor Q6 is connected to the base of an NPN transistor Q7 which may be of the type designated 2N5224, and to a grounded 2,200 picofarad capacitor C9. The crystal 100 is connected to a variable capacitor C10 which, in turn, is also connected to the base of the transistor Q7. The capacitor C10 may have a capacity of 4–40 pf.

The emitter of the transistor Q7 is connected to a grounded 68 ohm resistor R22, and the emitter of the transistor Q7 is connected to a 1 kilo-ohm resistor R23 which, in turn, is connected to a grounded 4.7 kilo-ohm resistor R24. The junction of the resistors R23 and R24 is connected to the base of an NPN transistor Q8 which may be of the type designated 2N5224. The emitter of the transistor Q8 is grounded, and the collector is connected to the +5 volt lead through a 1 kilo-ohm resistor R24. The collector of the transistor Q7 is also connected to the 5 volt lead, and the base of the transistor Q7 is also connected to the 5 volt lead, and the base of the transistor Q7 is connected to that lead through a 3.3 kilo-ohm resistor R25.

The output of the crystal oscillator 64 is connected to the frequency divider 66 which, as shown, is made up of five integrated circuits of the type designated 7490, connected as shown. The output of the frequency divider 66 is connected to the one-shot multivibrator 68 which is formed of an integrated circuit of the type 74121, as is the one-shot multivibrator 70.

The output of the one-shot multivibrator 70 is applied to the counter 58 to reset the counter at the end of each time base period. The counter 58 is made up of six decade counters of the type designated 7490. The holding register 60, as shown, is made up of six integrated circuits of the type designated 7475, whereas the decoder driver 62 is made up of six integrated circuits of the type designated 7447. One integrated circuit of each of the holding registers 60 and decoder driver 62 is used to drive a corresponding unit of the display 12.

The display test switch 22 is connected to the integrated circuits forming the decoder driver 62 through a 4.7 kilo-ohm resistor R40 and, when this switch is closed, all of the segments of each of the units of the display 12 is activated, so that an immediate indication may be had as to the effectiveness of all the segments of all the units of the display 12, and of the effectiveness of the corresponding units forming the decoder driver 62.

The various integrated circuits forming the system of FIG. 3 are available to the art, and the functions of the various logic components are known, so that no further description is required.

It will be appreciated that the present invention provides a simple and convenient test instrument for use in conjunction with vehicle detection systems, or for other frequency measuring, frequency counting, or inductance measuring of a variety of circuits and systems.

While a particular embodiment of the invention has been shown and described, modifications may be made. It is intended in the claims to cover the modifications which come within the spirit and scope of the invention.

What is claimed is:

1. A test instrument for measuring the inductance of a resonant loop/lead-in network, or the like, including: a first input terminal to be connected in circuit with the loop/lead-in network; an oscillator circuit connected to the first input terminal to generate pulses of a repetition frequency near the resonant frequency of the network; a second input terminal to be connected to an alternating current source; a verification circuit connected to said second input terminal for producing verification oscillations of a known frequency; a mode selector switch having first and second terminals respectively connected to the oscillator circuit and to the verification circuit and having a common terminal to be selectively connected to its first and second terminals; a counter connected to the common terminal of said mode selector switch; a holding register connected to the counter; display means connected to the holding register for displaying the contents of the holding register; and a reference circuit connected to the counter and to the holding register for applying a reference pulse thereto at the end of each of a succession of predetermined time intervals to cause the contents of the counter to be transferred to the holding register and to cause the counter to be reset at the end of each such predetermined time interval.

2. The test instrument defined in claim 1, in which said oscillator is a Class C oscillator.

3. The test instrument defined in claim 1, in which said mode selector switch includes a third terminal, and in which the test instrument includes an auxiliary input terminal connected to the third terminal of the mode selector switch.

* * * * *